(12) United States Patent
Jeanneau et al.

(10) Patent No.: US 7,677,498 B2
(45) Date of Patent: Mar. 16, 2010

(54) DEVICE AND METHOD FOR FASTENING AN AIRCRAFT RADOME

(75) Inventors: Charlotte Jeanneau, Levignac (FR); Jean-Claude Roques, Toulouse (FR); Rolland Gilabert, Rabastens (FR); Daniel Bellet, Tournefeuille (FR); Emmanuel Front, Toulouse (FR); Henri Rigal, Vielle-Adour (FR)

(73) Assignee: Airbus France, Toulouse (FR)

( * ) Notice: Subject to any disclaimer, the term of this patent is extended or adjusted under 35 U.S.C. 154(b) by 956 days.

(21) Appl. No.: 11/156,580

(22) Filed: Jun. 21, 2005

(65) Prior Publication Data
US 2007/0045467 A1    Mar. 1, 2007

(30) Foreign Application Priority Data
Jun. 29, 2004 (FR) ................... 04 07090

(51) Int. Cl.
    *B64C 1/00*   (2006.01)
(52) U.S. Cl. ................ 244/131; 244/132; 244/119; 244/121
(58) Field of Classification Search ......... 244/119–121, 244/131, 132; 411/383; 403/408.1
    See application file for complete search history.

(56) References Cited

U.S. PATENT DOCUMENTS

| 1,467,824 | A | * | 9/1923 | Ahlers | 411/270 |
| 2,510,110 | A | * | 6/1950 | Hickman | 102/374 |
| 2,755,216 | A | * | 7/1956 | Lemons | 156/155 |
| 2,820,499 | A |   | 1/1958 | Schaaf | |
| 3,020,946 | A |   | 2/1962 | Mills | |
| 3,188,961 | A | * | 6/1965 | Scruggs et al. | 244/159.1 |
| 3,545,146 | A |   | 12/1970 | Kerr | |
| 4,520,364 | A | * | 5/1985 | Perry | 343/872 |
| 4,760,493 | A | * | 7/1988 | Pearson | 361/218 |
| 5,139,361 | A | * | 8/1992 | Camuffo | 403/408.1 |
| 5,979,831 | A |   | 11/1999 | Seaquist | |
| 6,142,424 | A | * | 11/2000 | Wagner | 244/158.5 |
| 6,796,529 | B1 | * | 9/2004 | Duran et al. | 244/129.5 |
| 7,377,469 | B2 | * | 5/2008 | Cherian | 244/159.1 |

FOREIGN PATENT DOCUMENTS

| GB | 1092831 |   | 11/1967 |
| JP | 01125524 | A * | 5/1989 |

* cited by examiner

*Primary Examiner*—Michael R Mansen
*Assistant Examiner*—Joshua J Michener
(74) *Attorney, Agent, or Firm*—Oblon, Spivak, McClelland, Maier & Neustadt, L.L.P.

(57) ABSTRACT

A radome system for fastening an aircraft radome, wherein the system includes a plurality of first fasteners each designed to put the radome into a position along two distinct axes contained in a plane approximately perpendicular to the longitudinal axis (L) of this fastener; and a plurality of second fasteners each designed to put the radome into a position along a single axis of a plane approximately perpendicular to the longitudinal axis (L) of this fastener.

21 Claims, 6 Drawing Sheets

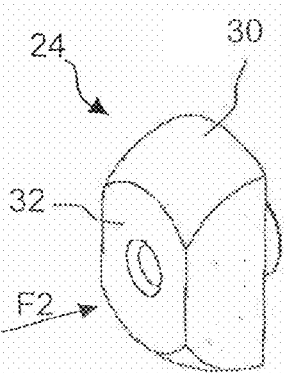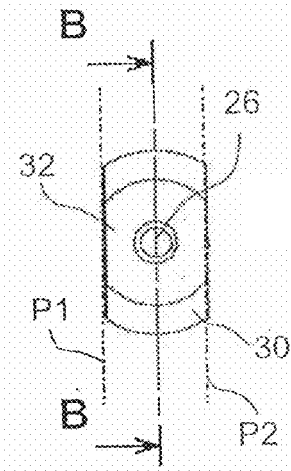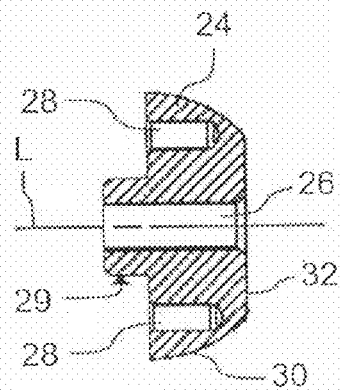
Fig. 6a　　　　Fig. 6b　　　　Fig. 6c
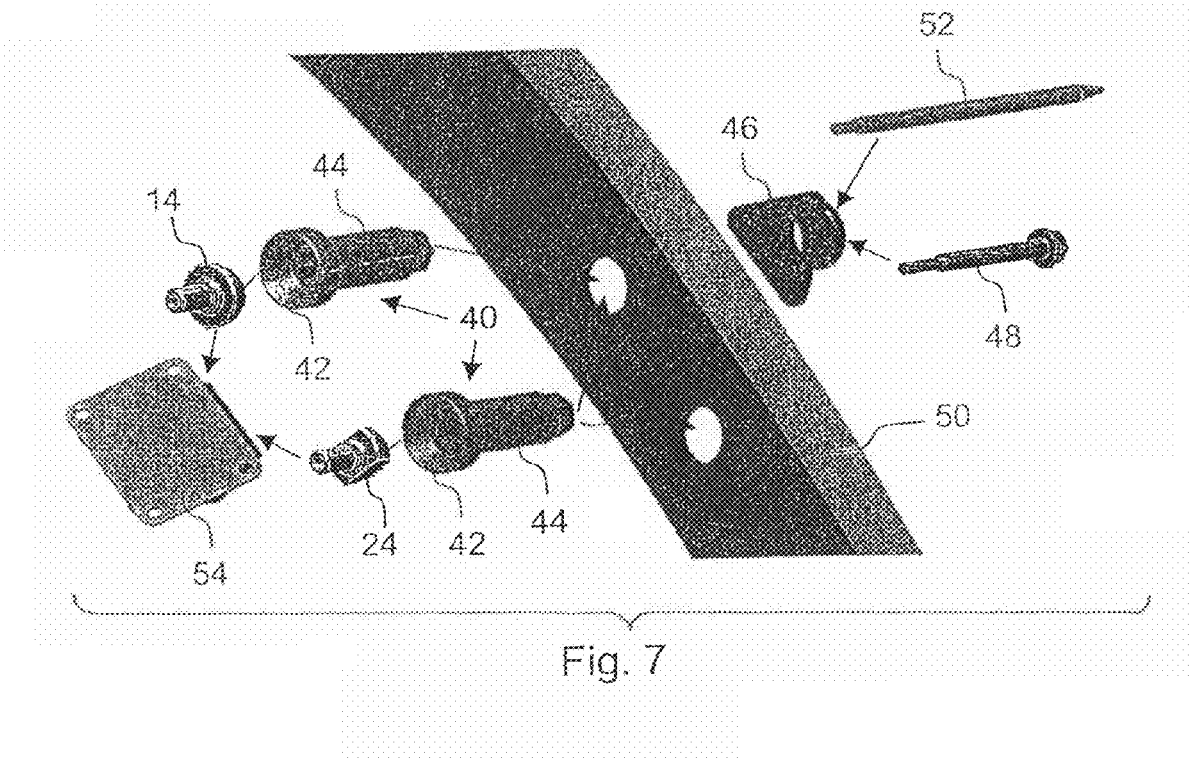
Fig. 7

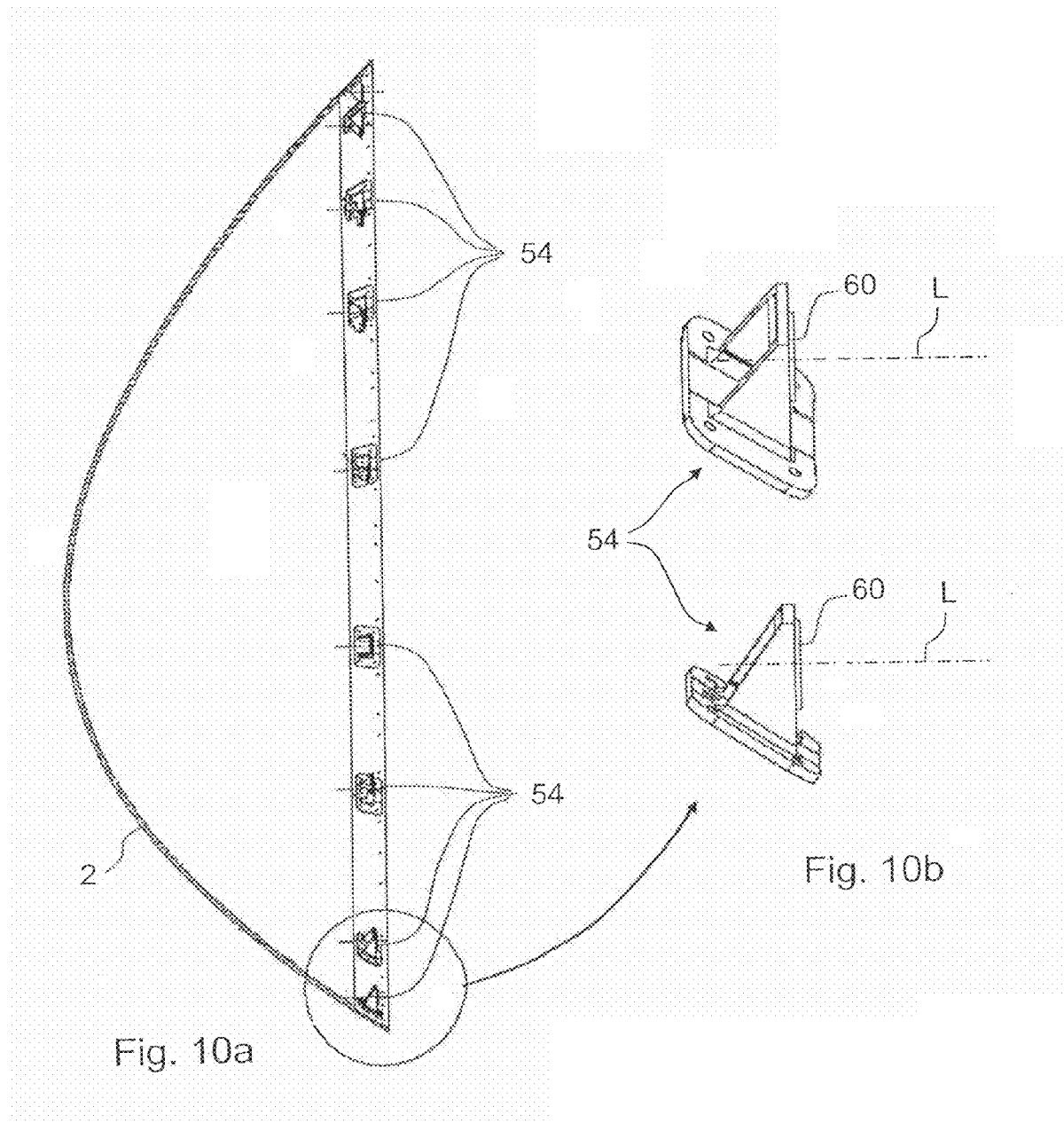

DEVICE AND METHOD FOR FASTENING AN AIRCRAFT RADOME

The purpose of the invention is a device for fastening an aircraft radome, particularly a radome located it the nose of this aircraft. It also relates to an aircraft fitted with such a fastening device and a method for fastening a radome on an aircraft.

Most aircraft, and particularly civil transport aircraft, comprise a radome located in the nose of the fuselage. FIG. 1 shows such a radome 2 fixed in the nose of the fuselage 1 of an aircraft. FIG. 2 shows a perspective view of such a radome, particularly its periphery 3 that can come into contact with the fuselage 1 of the aircraft. In general, this radome protects a radar and is consequently made from a material permeable to electromagnetic waves, for example an electrically insulating composite material. Such a material is usually more flexible and more deformable than the structure of the fuselage on which this radome is fixed. The radome 2 must be fixed onto the aircraft 1 firstly with clearances less than a predetermined value at the junction between the perimeter 3 of the radome and the fuselage 1 of the aircraft, and secondly avoiding level differences between the surface of the radome and the surface of the fuselage that would cause a discontinuity in the airflow on the surface of the aircraft, and consequently turbulence that could reduce the aerodynamic performances of said aircraft, so as to guarantee the best aerodynamic performances of said aircraft.

As shown in FIG. 3, a radome 2 may be fixed onto the fuselage 1 of an aircraft in a known manner using firstly rams 4 for releasing said radome, for example during maintenance operations on a radar located in the nose of the fuselage 1, and secondly locking means 5 to hold this radome in place on the fuselage when the aircraft is being used. Such a fastening device is usually satisfactory for radomes in the nose of small or medium sized aircraft. However, for wide body or very wide body aircraft for which the dimensions of the nose radome are adapted to the dimensions of said aircraft, such a fastening device has the disadvantage of introducing level differences between the surface of the radome and the surface of the aircraft fuselage, due to the flexibility of said radome inherent to the characteristics of the material from which this radome is made.

These problems are solved according to the invention by a device for fastening an aircraft radome, characterised in that it comprises:

a plurality of first fasteners each designed to put said radome into a position along two distinct axes contained in a plane approximately perpendicular to the longitudinal axis of this fastener; and a plurality of second fasteners each designed to put said radome into a position along a single axis of a plane approximately perpendicular to the longitudinal axis of this fastener.

In this manner, said first fasteners enable the radome to be centred on the fuselage of the aircraft while said second fasteners put the radome into position, between said first fasteners while maintaining a positioning freedom along an axis during assembly of said second fasteners. Therefore, this device can solve the problems according to prior art.

Preferably, said single axis along which the radome is positioned by each of said second fasteners is approximately perpendicular to the tangent to the perimeter of the radome at the point at which the distance between firstly said perimeter of the radome that can come into contact with the fuselage and secondly the longitudinal axis of said fastener is minimum. In this way, the device according to the invention assures that there is no level difference between the outside surface of the radome and the outside surface of the fuselage, while maintaining assembly clearances at each of the second fasteners, along a direction parallel to the tangent to the perimeter of the radome in contact with the fuselage at the point at which the distance between firstly said perimeter of the radome in contact with the fuselage and secondly the longitudinal axis of said fastener is minimum.

In one embodiment of the invention, said plane approximately perpendicular to the longitudinal axis of each fastener is approximately perpendicular to the longitudinal axis of the aircraft.

Advantageously, said first and second fasteners are accessible from inside said radome. Thus, these fasteners do not require any external element outside the surface of the radome or the fuselage which could degrade the aerodynamic performances of the aircraft.

In one embodiment of the invention, said first and second fasteners each comprise a convex-shaped part fixed to the radome that can be engaged in a concave-shaped part fixed to the aircraft fuselage. However, this embodiment is not exclusive and a variant would also be possible in which said first and second fasteners each comprise a concave-shaped part fixed to the radome that can be engaged in a convex-shaped part fixed to the aircraft fuselage.

Advantageously, said convex-shaped part for the first fasteners is approximately hemispherical in shape. The convex-shaped part for the second fasteners is approximately hemispherical in shape, truncated by two planes approximately parallel to the longitudinal axis of the fastener and located on each side of this longitudinal axis. These two planes can be used to define said single axis contained in a plane approximately perpendicular to the longitudinal axis of the second fastener considered and according to which said fastener positions the radome. This single axis is parallel to these two planes and perpendicular to the longitudinal axis of the fastener considered. The fact that this approximately hemispherical part is truncated means that an assembly clearance is possible during insertion of said part in the convex part of the second fastener considered.

Also advantageously, said approximately hemispherical part of the first and second fasteners is truncated in the part opposite its base.

Preferably, the concave-shaped part in each of the first and second fasteners is complementary to the approximately hemispherical-shaped part corresponding to the first fasteners.

Also preferably, said first and second fasteners comprise a fitting fixed to the fairing of the radome.

In one embodiment of the invention, said first and second fasteners are screwed fasteners.

In this case, the concave-shaped part of the first and second fasteners is advantageously drilled along the longitudinal axis of the fastener considered so that a screw can be fitted in it to solidarise this concave-shaped part with the complementary convex-shaped part.

Also in this case, the convex-shaped part of each of the first and second fasteners is advantageously drilled along the longitudinal axis of the fastener considered and is threaded on the inside so that a screw can be inserted in it to fix this convex-shaped part with the complementary concave-shaped part.

Preferably, the convex-shaped part of each of the first fasteners can hold a guide rod that can cooperate with the concave-shaped part of the fastener considered to guide the radome during placement of said radome on the fuselage.

In one preferred embodiment of the invention, at least part of said first and/or second fasteners is made at least partially from an electrically conducting material and is electrically connected to a conducting element located on the outside surface of the radome.

The number and size of the electrically conducting fasteners are then advantageously designed to enable currents due to lightning strikes on the radome to travel towards the aircraft fuselage.

The invention also relates to an aircraft comprising a nose radome characterised in that said radome is fixed to the aircraft fuselage using such a fastening device.

The invention also relates to an assembly method for assembling a radome on the nose of an aircraft that is remarkable in that it comprises the following steps:
- a1) fix a set of fittings inside said radome, distributed close to the perimeter of this radome coming into contact with the aircraft fuselage;
- b1) choose a subset of fittings distributed among the set of fittings fixed to the radome in step a1) and fix a convex-shaped part corresponding to a first fastener, as described above, onto each of the fittings of said subset;
- b2) fix a convex-shaped part corresponding to a second fastener, as described above, on each of the fittings placed during step a1) and not belonging to the subset chosen in step b1), orienting said convex-shaped part such that said single axis contained in a plane perpendicular to the longitudinal axis of this fastener, according to which said second fastener positions the radome is approximately perpendicular to the tangent to the perimeter of the radome at the point at which the distance between firstly said perimeter of the radome that can come into contact with the fuselage and secondly the longitudinal axis of said fastener is minimum;
- c) fix concave-shaped parts on a fuselage frame, so that these concave-shaped parts are facing each of said convex-shaped parts when the radome is in its planned position on the aircraft;
- d) put guide rods into position on each of the convex-shaped parts corresponding to first fasteners put into position during step b1);
- e) offer up the radome in front of the fuselage and insert said guide rods placed in step d) into the concave-shaped parts corresponding to them fixed on the fuselage in step c) until said guide rods pass through said concave-shaped parts;
- f) put a locking device into position at the end of each of said guide rods so as to secure placement of the radome on the aircraft fuselage;
- g) put a screw into position in each of the concave-shaped parts of the second fasteners, through the face of said concave part opposite its face in contact with the convex part fixed to the radome and screw this screw into this convex part;
- h) remove the guide rods from the first fasteners and replace them with screws in the same way as for the second fasteners (step g)).

Advantageously, the assembly method for a radome according to the invention also comprises the following step after step a1):
- a2) surface, and bore each of the fittings put into place in step a1).

The invention will be better understood after reading the following description and studying the appended figures. Identical references in these figures denote similar elements:

FIG. 1 already described shows an aircraft comprising a radome on its nose.

FIG. 2 already described is a perspective view of a radome.

FIG. 3 already described is a view of a fastening device according to prior art.

FIG. 4 is a perspective view of a radome comprising parts of first and second fasteners according to the invention.

FIG. 5a is a perspective view of a convex-shaped part of a first fastener; FIG. 5b shows a plane view of this convex part, along arrow F in FIG. 5a; FIG. 5c is a sectional view along line A-A in FIG. 5b.

FIG. 6a shows a perspective view of a convex part of a second fastener; FIG. 6b shows a plane view of this convex part along arrow F2 in FIG. 6a; FIG. 6c is a sectional view along line B-B in FIG. 6b.

FIG. 7 shows an exploded perspective view of a first or second fastener according to the invention.

FIG. 10a shows a sectional view of a radome in the nose of an aircraft on which fittings of the first and/or second fasteners according to the invention are fixed; FIG. 10b shows a detailed view of two fittings located in the lower part of FIG. 10a and surrounded by a circle in said FIG. 10a.

Figure 1:
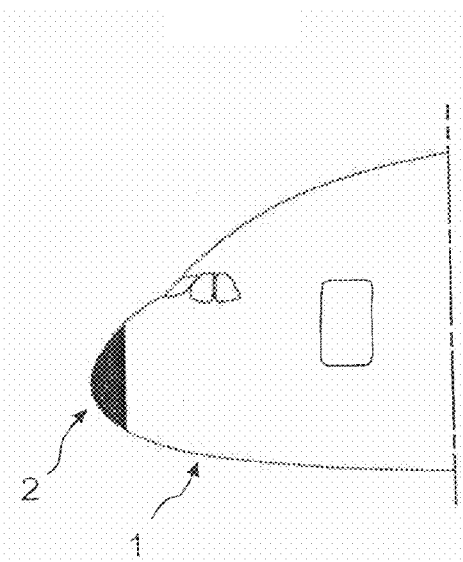
Figure 2:
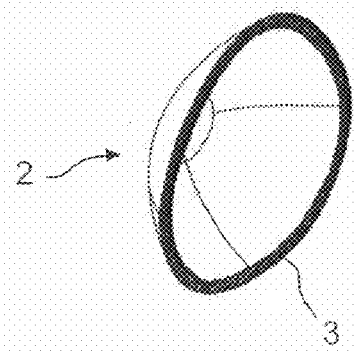
Figure 3:
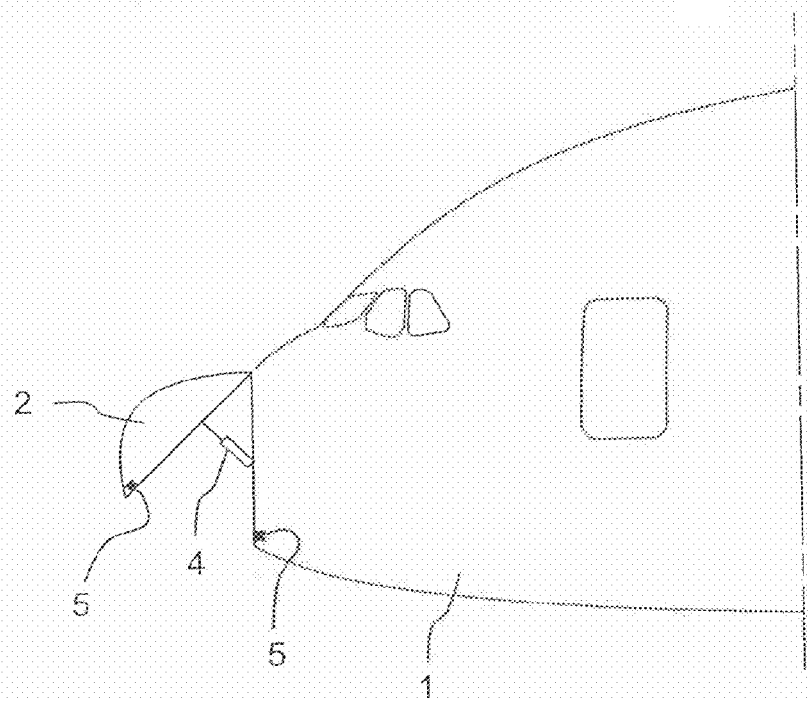
Figure 4:
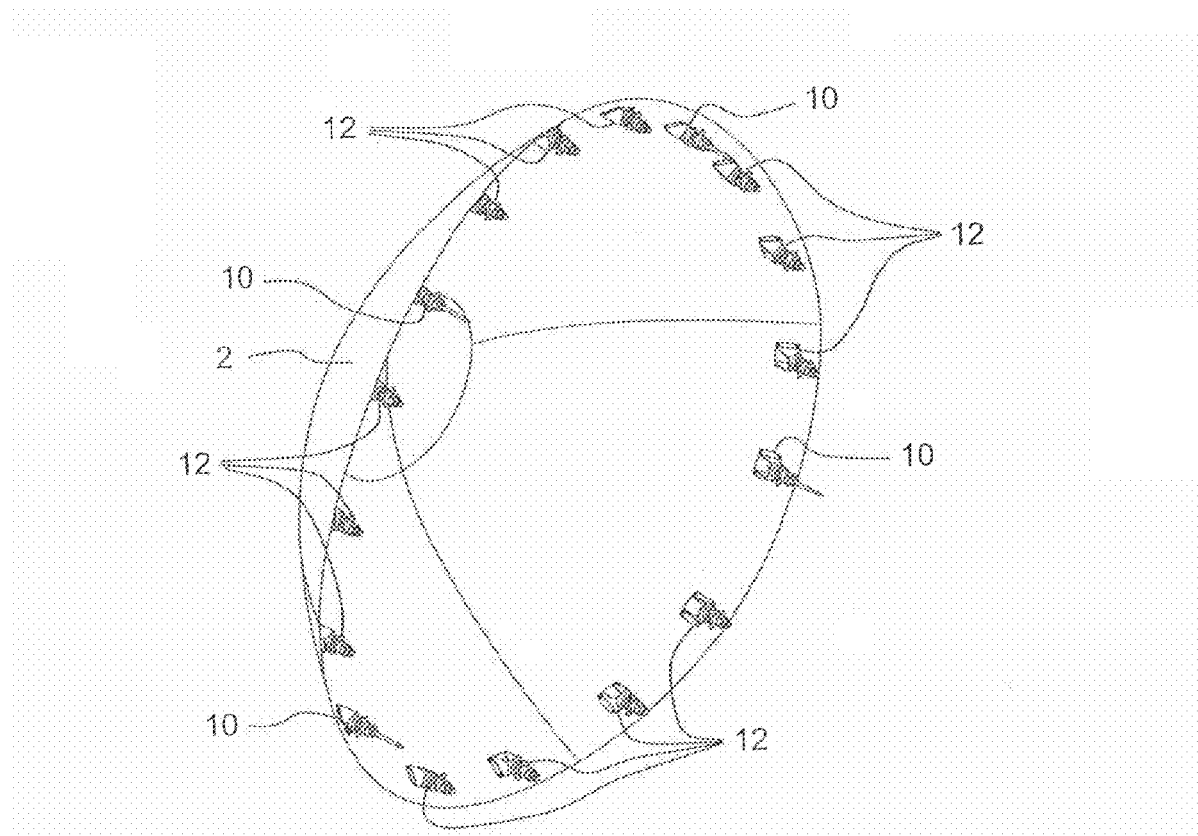

In one preferred embodiment partially shown in FIG. 4, the fastener device for an aircraft radome 2 according to the invention comprises:
- a plurality of first fasteners 10 each capable of positioning said radome along two distinct axes contained in a plane approximately perpendicular to the longitudinal axis L of this fastener; and
- a plurality of second fasteners 12 each capable of positioning said radome along a single axis of a plane approximately perpendicular to the longitudinal axis L of this fastener.

The fuselage 1 of the aircraft is not shown in this figure. Four first fasteners 10 are arranged on the inside of the radome close to the perimeter 3 of the radome that can come into contact with the aircraft fuselage. Advantageously, these first fasteners are distributed, preferably fairly regularly, close to said perimeter 3. In this way, they are used to centre the radome 2 on the aircraft fuselage 1. Second fasteners 12 are distributed approximately uniformly between said first fasteners 12 inside the radome, close to said perimeter 3 of the radome. In the embodiment shown in FIG. 4, thirteen second fasteners 12 are distributed between the first four fasteners 10. These fasteners 10, 12 are arranged inside the radome 2, this embodiment has the advantage that it does not include any fastener part external to the radome 2 or the fuselage 1 and consequently does not disturb the aerodynamic performances of the aircraft.

Figure 5A:
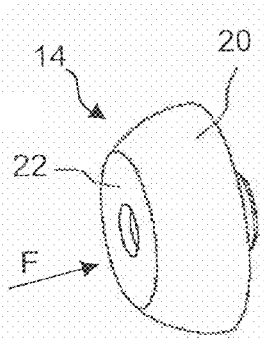
Figure 5B:
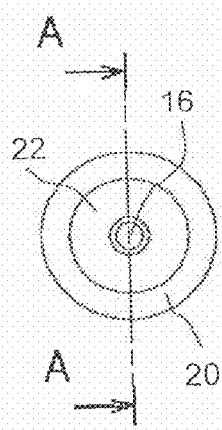
Figure 5C:
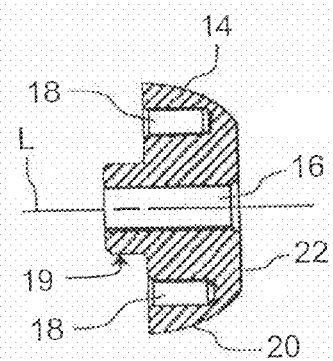

Each of said first and second fasteners comprises a convex-shaped part 14, 24 fixed to the radome 2. A convex-shaped part 14 corresponding to the first fasteners 10 is shown in FIGS. 5a, 5b and 5c. This part 14 comprises an approximately hemispherical-shaped surface 20. This surface is truncated in the part opposite its base which consequently has a plane part 22. Preferably, the base is extended by a cylindrically shaped part 19 coaxial with the longitudinal axis L of the fastener considered. This part 19 centres said part 14 on a support fixed to the radome 2. In one embodiment, said base of the approximately hemispherical-shaped part 20 comprises threaded holes 18 used for fastening the part 14 onto said support fixed to the radome. However, this fastening mode is not exclusive and variants could be considered. In one variant, the cylindrically shaped part 19 is threaded so that it can be screwed into a threaded hole in said support fixed to the radome, or it can be fixed onto said support using a nut. In this case, the part 19 is used for centring and fastening the part 14 onto said support. Advantageously, the part 14 is drilled with a threaded hole 16 along the longitudinal axis L of the fastener considered. Similarly, a convex-shaped part 24 corresponding to the second fasteners 12 is shown in FIGS. 6*a*, 6*b* and 6*c*. This part 24 comprises an approximately hemispherical-shaped surface 30. This surface is truncated in the part opposite its base, which consequently has a plane part 32. It is also truncated by two planes P1 and P2 approximately parallel to the longitudinal axis L of the fastener considered and located on each side of said longitudinal axis L. Said single axis of a plane approximately perpendicular to the longitudinal axis L of the fastener, according to which the second fastener considered positions the radome 2, is then parallel to the line B-B shown in FIG. 6*b*. Furthermore, said single axis has an intersection with said longitudinal axis L. Preferably, the base is extended by a cylindrically shaped part 29 coaxial with the longitudinal axis L of the fastener considered. This part 29 is used for centring said part 24 on a fixed support of the radome 2. In one embodiment, said approximately hemispherical-shaped base 30 comprises threaded holes 28 used for fastening the part 24 onto said support fixed to the radome. However, this fastening mode is not exclusive and variants could be envisaged. In one variant, the cylindrically shaped part 29 is threaded so that it can be either screwed into a threaded hole in said support fixed to the radome, or it can be fixed onto said support using a nut. In this case, the part 29 centres and fastens the part 24 onto said support. Advantageously, the part 24 is drilled with a threaded hole 26 along this longitudinal axis L of the fastener considered.

In one preferred embodiment of the convex part 24 of the second fasteners 12, the diameter of the plane face 32 of this convex part is slightly less than the diameter of a complementary plane face in the concave part 42 of the second fastener considered, on which the plane face bears in contact when said second fastener is assembled.

Figures 9A, 9B, 9C:
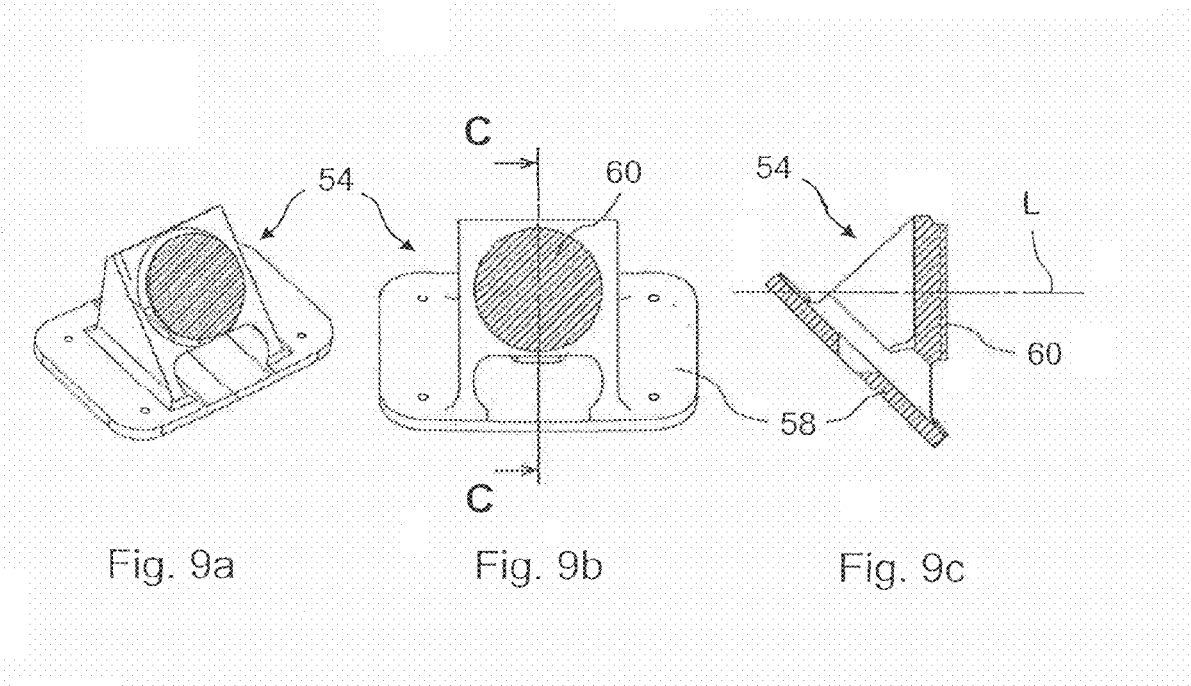
FIGS. 9a and 9b show perspective views of a fitting.
FIG. 9c shows a sectional view along line C-C in FIG. 9b.

Said fixed support of the radome 2 is preferably a fitting 54 shown in FIGS. 9*a*, 9*b* and 9*c*. This fitting comprises a base 58 that can be fixed on an inside surface of the radome 2. It also comprises a plane face 60 approximately perpendicular to the longitudinal axis L of the fastener considered. When the convex parts 14, 24 comprise a cylindrical part 19, 29, this plane face 60 comprises a hole (not shown) coaxial with said longitudinal axis L and that can hold said cylindrical part. FIG. 10*a* is a sectional view of a radome 2 on which fittings 54 are fixed corresponding to first and second fasteners of said radome on the fuselage of an aircraft. In one preferred embodiment shown in this figure, the plane faces 60 of the different fittings 54 are oriented such that the longitudinal axes L of each of said fasteners (that are approximately perpendicular to said plane faces 60) are approximately parallel to each other and to the longitudinal axis of the aircraft on which the radome 2 must be fixed. To achieve this, the different fittings 54 may have different geometric shapes and be adapted to the positions of the radome 2 onto which said fittings are fixed. FIG. 10*b* shows details of the two lower fittings in FIG. 10*a*, in position on the radome 2.

Figure 8:
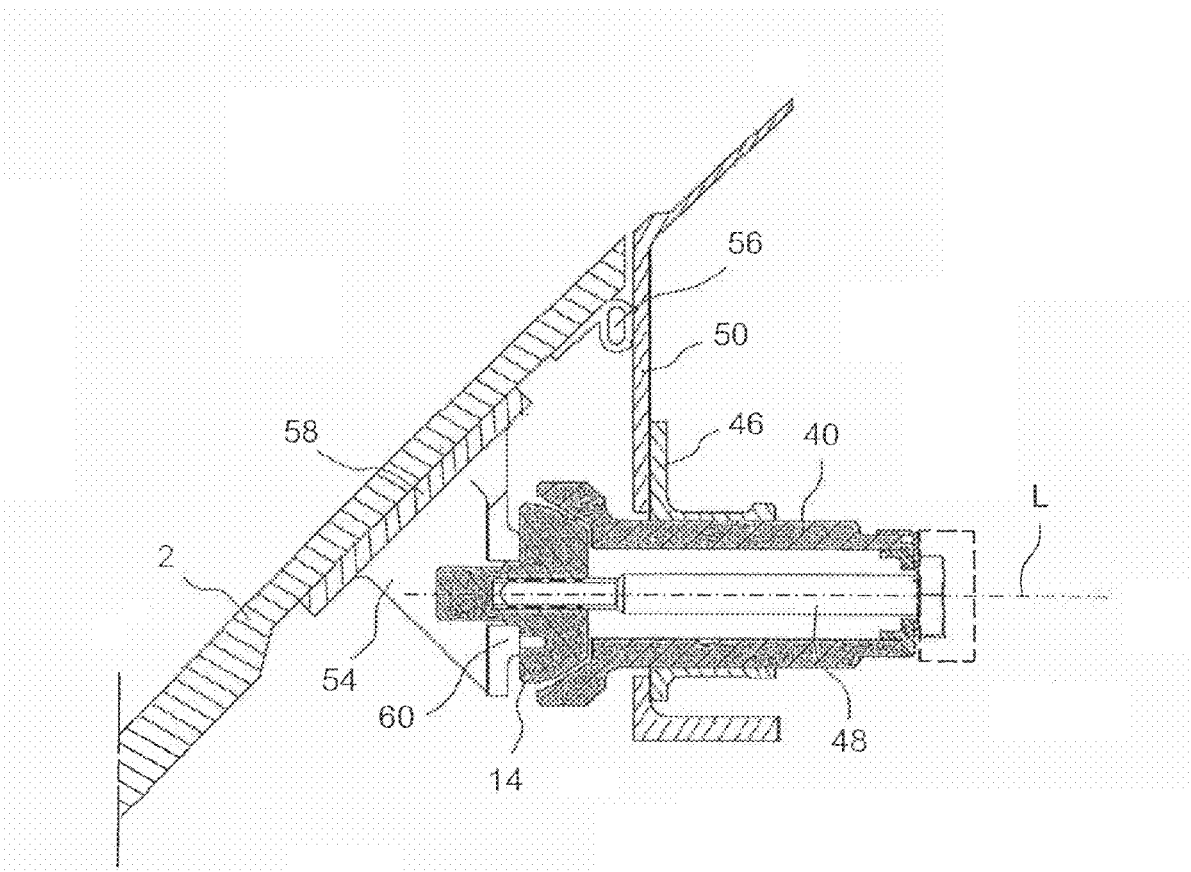
FIG. 8 shows an assembled sectional view of a first or second fastener according to the invention.

FIGS. 7 and 8 indifferently show a first and second fastener 10, 12 according to the invention. A fitting 54 is fixed by its base 58 on the radome 2. A convex part 14 (or 24) is fixed onto the plane face 60 of this fitting. A stud 40 facing said convex part is fixed onto a frame 50 of the fuselage 1 of the aircraft. This stud 40 comprises a concave part 42 complementary to said convex part 14 and a cylindrical part 44 that can fit into a hole of said frame 50 of the fuselage, said hole being coaxial with the longitudinal axis of the fastener considered. In one preferred embodiment shown in FIGS. 7 and 8, said cylindrical part 44 is threaded and a stirrup 46 is fixed onto the frame 50. This stirrup 46 comprises a threaded hole coaxial with the longitudinal axis of the fastener considered, into which said threaded cylindrical part 44 can be fixed. This advantageously enables said stud 40 to be fastened to the fuselage frame 50, and adjustment of the position of the concave part 42 of said stud 40 along the longitudinal axis L of the fastener. The stud 40 is drilled with a hole coaxial with the longitudinal axis of the fastener considered. This hole holds a screw 48, one end of which can be engaged in the threaded hole 16, 26 of the convex part 14, 24. This screw thus solidarises said convex part 14, 24 onto the stud 40 and therefore fixes it to the frame 50 of the fuselage 1. Advantageously, a seal 56 is fixed onto the radome 2 close to said perimeter 3 of the radome. This seal comes into contact with the fuselage 1 of the aircraft so as to seal the volume inside the radome.

The threaded hole 16 of the convex part 14 of the first fasteners 10 can hold a cylindrical guide rod 52 comprising a threaded end that can be screwed into this threaded hole. Preferably, the hole formed in the stud 40 coaxial with the longitudinal axis L of the fastener, has a diameter sufficiently larger than the diameter of this guide rod 52 to facilitate insertion of this guide rod into this hole. For example, the diameter of the hole may be chosen to be 2 to 3 times greater than the diameter of the guide rod 52.

Since the concave part 42 is complementary to a convex part 14 in the first fastener, it has a number of advantageous results:

firstly, each first fastener 10 fixes the position of the radome 2 relative to the fuselage 1 at the location of said fastener. The convex part 14 centres itself in the concave part 42 with no degrees of freedom, thus positioning the radome 2 relative to the fuselage 1 along two axes of a plane perpendicular to the longitudinal axis L of this fastener and also along said longitudinal axis L; and secondly, each second fastener 12 holds the radome 2 in position on the fuselage 1 while maintaining one degree of freedom during assembly of said fastener. Since the convex part 24 is truncated by planes P1 and P2, it can be positioned in the concave part 42 while enjoying an assembly clearance about an axis approximately perpendicular to these two planes and the longitudinal axis of said fastener. Thus, when the convex part 24 is oriented such that the single axis of a plane approximately perpendicular to the longitudinal axis L of this second fastener, according to which this second fastener fixes the position of the radome 2, is approximately perpendicular to the tangent to the perimeter of the radome at the point at which the distance between firstly said perimeter 3 of the radome 2 and secondly the longitudinal axis L of this fastener is minimum (said single axis parallel to line B-B shown in FIG. 6*b*, is then included in the section plane in FIG. 8), this fastener being used to fix the position of the radome 2 flush with the fuselage 1 while maintaining an assembly clearance along an axis perpendicular both to said single axis and to the longitudinal axis L of the fastener. The value of this assembly clearance may be several millimetres. This assembly clearance is sufficient to install the radome 2 onto the fuselage 1 of the aircraft without creating any mechanical stresses in this radome, even if there are deformations of said radome particularly due to the fact that the material from which the radome is made is more flexible and more deformable than the structure of the fuselage on which this radome is fixed. Each second fastener 12 also enables positioning of the radome 2 relative to the fuselage 1 along the longitudinal axis L of this second fastener.

In the preferred embodiment of the convex part 24 of the second fasteners 12, according to which the diameter of the plane face 32 of this convex part is slightly smaller than the diameter of a complementary plane face in the concave part 42 of the second fastener considered, onto which the plane face bears when said second fastener is assembled, said diameter of the plane face 32 is chosen such that the second fastener considered comprises a small radial clearance with respect to the longitudinal axis L of this fastener, equal to a few tens of a millimetre, preferably about 5 tenths of a millimetre. This small radial clearance facilitates the assembly of the fastener considered, particularly if there are any differences in the geometry of the different parts due to manufacturing tolerances, but without having any significant consequences on the quality of the level difference between the external surface of the radome 2 and the outside surface of the fuselage 1.

The external surface of the radome 2 may comprise metallic strips used to carry currents due to lightning strikes on this radome towards the aircraft fuselage 1. Advantageously, the different parts 54, 14, 24, 40, 46, 48, 50 making up at least some of the first and/or second fasteners 10, 12 are electrically conducting such that the fastener considered achieves electrical continuity between the radome and the aircraft fuselage 1. Said metallic strips are electrically connected to electrically conducting fittings 54 of the fasteners 10, 12, for example using screws passing through the wall of the radome 2. The number and dimensions of the electrically conducting fasteners are chosen to allow maximum currents caused by lightning strikes on the radome 2 to travel towards the fuselage. These maximum currents are the currents used during certification of the aircraft by the different certification authorities. In one preferred embodiment, the different fasteners 10, 12 are all conducting. In the embodiment corresponding to FIG. 4 in which four first fasteners 10 and thirteen second fasteners 12 are used, the average diameter of the approximately spherical part 20, 30 of the convex parts 14, 24 is approximately 38 millimetres, the distance between planes P1 and P2 of the convex parts 24 of the second fasteners is equal to approximately 24 millimetres and the diameter of the screws 48 is equal to about 9 millimetres. These characteristics are sufficient to resist firstly the mechanical forces necessary for fastening the radome 2 onto the fuselage 1, and secondly to allow said lightning currents to travel towards the fuselage.

Figure 11:
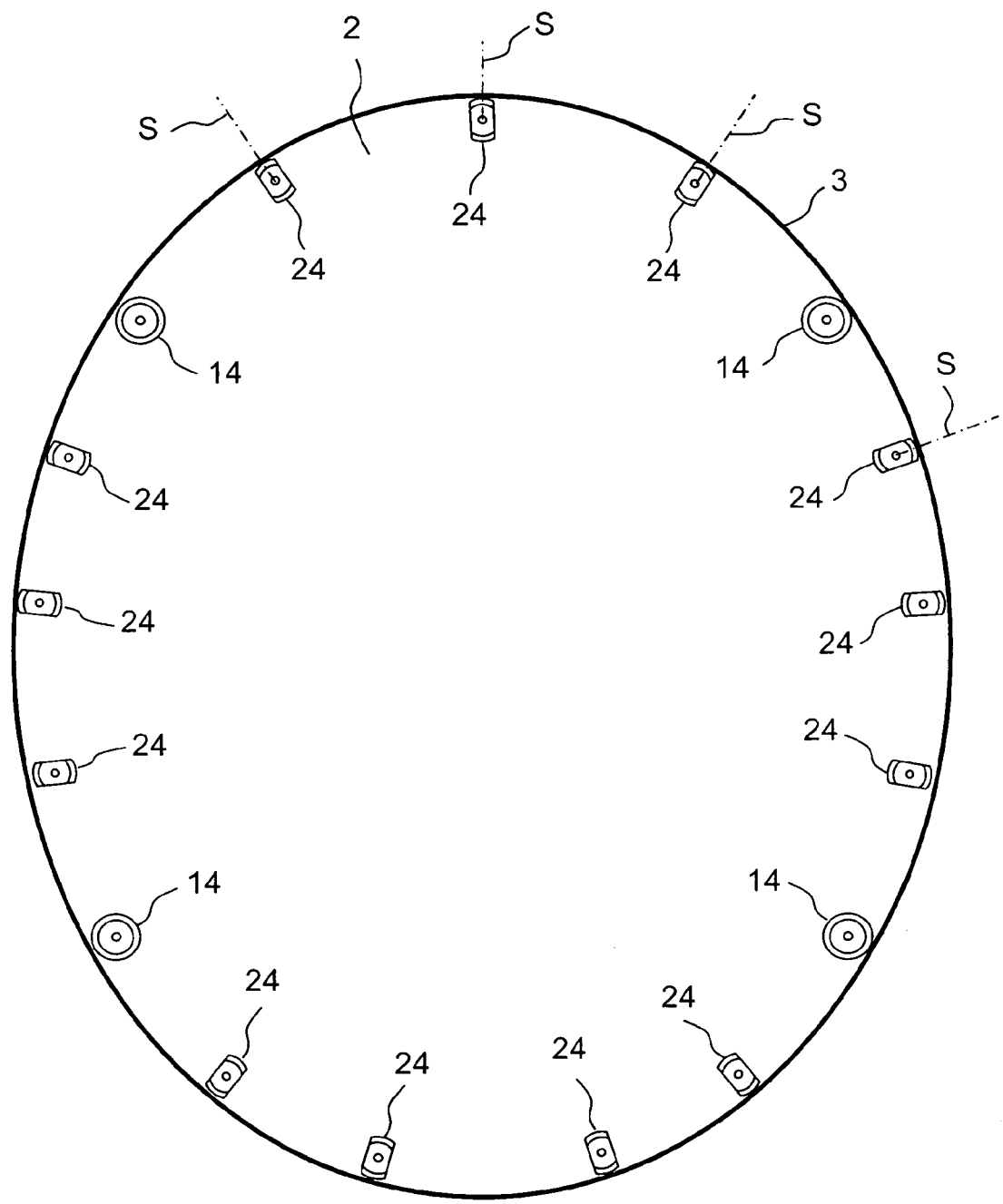
FIG. 11 shows an inside view of a radome fitted with first and second fasteners according to the invention, from its open part for which the perimeter can come into contact with the fuselage of the aircraft. Only the convex parts of fasteners are shown, to make the figure more easily understandable.

The invention also relates to a method for assembly of a radome 2 on the nose of an aircraft that in one preferred embodiment comprises the following steps:

a1) fix a set of fittings 54 inside said radome, distributed close to the perimeter 3 of this radome coming into contact with the aircraft fuselage 1;

a2) surface, and bore each of the fittings (54) put into place in step a1). This step advantageously enables precise positioning of each fastener as required for the radome 2;

b1) choose a subset of fittings distributed among the set of fittings fixed to the radome in step a1) and fix a convex-shaped part 14 corresponding to a first fastener 10 onto each of the fittings 54 of said subset, as shown in FIG. 11;

b2) fix a convex-shaped part 24 corresponding to a second fastener 12 on each of the fittings 54 placed during step a1) and not belonging to the subset chosen in step b1), orienting said convex-shaped part such that said single axis S according to which said second considered fastener positions the radome is approximately perpendicular to the tangent to the perimeter 3 of the radome at the point at which the distance between firstly said perimeter of the radome and secondly the longitudinal axis of said fastener is minimum. The orientation of the convex parts 14 from perimeter 3 of the radome is shown in FIG. 11. Only said single axis S is shown for only four of the convex parts 14, in order to make the figure clearer;

c) fix studs 40 each comprising a concave-shaped part 42 onto the frame 50 of the fuselage 1, so that these concave-shaped parts are facing each of said convex-shaped parts 14, 24 when the radome is in its planned position on the aircraft;

d) put guide rods 52 into position on each of the convex-shaped parts 14 corresponding to the first fasteners put into position during step b1);

e) offer up the radome in front of the fuselage and insert said guide rods 52 placed in step d) into the concave-shaped parts 42 corresponding to them fixed on the fuselage in step c) until said guide rods pass through said concave-shaped parts and the corresponding studs 40;

f) put a locking device into position at the end of each of said guide rods 52 so as to secure placement of the radome 2 on the aircraft fuselage 1;

g) put a screw 48 into position in the holes, coaxial with said longitudinal axis L, of each stud 40 (and consequently each concave part 42) of second fasteners 12, through the face of said stud opposite its concave part 42 in contact with the convex part 24 fixed to the radome and screw this screw into the threaded hole 26 of this convex part 24;

h) remove the guide rods 52 from the first fasteners 10 and replace them with screws 48 in the same way as for the second fasteners (step g)).

The invention claimed is:

1. A radome system for an aircraft having a fuselage, said radome system comprising:

a radome having a curved inside surface and an outside surface;

a plurality of first fasteners mounted substantially equidistant to each other along an entire inner perimeter of said radome and on the curved inside surface of said radome, each first fastener comprising a first radome member attached to the radome, a corresponding first fuselage member configured to attach the first radome member to the fuselage and a first linking member linking the first radome member to the first fuselage member, each first radome member being configured to have zero degrees of freedom relative to the first linking member during positioning of the radome relative to the fuselage and said radome is fixed along two distinct axes contained in a plane approximately perpendicular to a longitudinal axis of each first fastener; and a plurality of second fasteners distributed between said plurality of first fasteners and mounted on the inside of said radome, each second fastener comprising a second radome member attached to the radome, a corresponding second fuselage member configured to attach the second radome member to the fuselage and a second linking member linking the second radome member to the second fuselage member, each second radome member being configured to have one degree of freedom relative to the second linking member during positioning of the radome relative to the fuselage and said radome is fixed along a single axis of a plane approximately perpendicular to a longitudinal axis of each second fastener.

2. The radome system according to claim 1, wherein said single axis along which the radome is positioned by each of said second fasteners is approximately perpendicular to a tangent to the perimeter of the radome at a point at which a distance between said perimeter of the radome the longitudinal axis of said each second fastener is minimum.

3. The radome system according to claim 1, wherein said plane approximately perpendicular to the longitudinal axis of each fastener is approximately perpendicular to a longitudinal axis of the aircraft.

4. The radome system according to claim 1, wherein said first and second fasteners are accessible from inside said radome.

5. The radome system according to claim 1, wherein said first and second radome members each comprise a convex-shaped part fixed to the radome, said convex-shaped part being configured to engage in a concave-shaped part fixed to the aircraft fuselage.

6. The radome system according to claim 1, wherein said first and second radome members each comprise a concave-shaped part fixed to the radome, said concave-shaped part being configured to engage in a convex-shaped part fixed to the aircraft fuselage.

7. The radome system according to claim 5, wherein said convex-shaped part, for the plurality of first fasteners, is approximately hemispherical in shape.

8. The radome system according to claim 5, wherein said convex-shaped part for the plurality of second fasteners, is approximately hemispherical in shape, truncated by two planes approximately parallel to the longitudinal axis of each respective second fastener and located on each side of the longitudinal axis of each respective second fastener.

9. The radome system according to claim 7, wherein said approximately hemispherical part is truncated in a part opposite its base.

10. The radome system according to claim 8, wherein said concave-shaped part of each of the first and second fasteners is complementary to the convex-shaped part approximately in an hemispherical shape corresponding to the plurality of first fasteners.

11. The radome system according to claim 1, wherein said first and second fasteners comprise a fitting fixed to a fairing of the radome.

12. The radome system according to claim 1, wherein said first and second fasteners are screwed fasteners.

13. The radome system according to claim 5, wherein the concave-shaped part of the first and second fasteners is drilled along the longitudinal axis of the corresponding fastener so that a screw can be fitted in the concave-shaped part to solidarise the concave-shaped part with the complementary convex-shaped part.

14. The radome system according to claim 13, wherein the convex-shaped part of each of the first and second fasteners is drilled along the longitudinal axis of the corresponding fastener and is threaded on the inside so that a screw can be inserted in the convex-shaped part to fix the convex-shaped part with the complementary concave-shaped part.

15. The radome system according to claim 14, wherein the convex-shaped part of each of the first fasteners is configured to hold a guide rod that is inserted through the concave-shaped part of the corresponding fastener to guide the radome during placement of said radome on the fuselage.

16. The radome system according to claim 1, wherein at least a plurality of fasteners selected from said first and second fasteners is made at least partially from an electrically conducting material and is electrically connected to a conducting element located on the outside surface of the radome.

17. The radome system according to claim 16, wherein a number and dimensions of the electrically conducting fasteners allow maximum currents caused by lightning strikes on the radome to travel towards the fuselage.

18. The radome system according to claim 1, wherein said plurality of first fasteners are structurally different in configuration from said plurality of second fasteners in that each first radome member includes a non-truncated convex-shaped part, and each second radome member includes a truncated convex-shaped part.

19. The radome system according to claim 18, wherein said truncated convex-shaped part is truncated by two planes approximately parallel to a longitudinal axis of each corresponding second fastener from said plurality of second fasteners located on each side of the longitudinal axis of each corresponding second fastener from said plurality of second fasteners.

20. The radome system according to claim 18, wherein said radome system is free of any fastener mounted on the outside surface of said radome.

21. An aircraft comprising a radome system according to claim 1.

* * * * *